(12) United States Patent
Kim et al.

(10) Patent No.: US 7,897,270 B2
(45) Date of Patent: Mar. 1, 2011

(54) ORGANIC LIGHT EMITTING DIODE DISPLAY AND MANUFACTURING METHOD THEREOF

(75) Inventors: Tae-Whan Kim, Seoul (KR);
Dong-Chul Choo, Seoul (KR);
Chang-Uk Kim, Busan-si (KR)

(73) Assignees: Samsung Electronics Co., Ltd. (KR);
Industry-University Cooperation Foundation Hanyang University (KR)

( * ) Notice: Subject to any disclaimer, the term of this patent is extended or adjusted under 35 U.S.C. 154(b) by 898 days.

(21) Appl. No.: 11/647,880

(22) Filed: Dec. 29, 2006

(65) Prior Publication Data

US 2008/0007170 A1   Jan. 10, 2008

(30) Foreign Application Priority Data

Jul. 10, 2006   (KR) .................... 10-2006-0064377

(51) Int. Cl.
*H01L 51/52* (2006.01)
*H01L 51/54* (2006.01)

(52) U.S. Cl. .................. 428/690; 313/504; 313/506; 257/40

(58) Field of Classification Search .......... 257/40; 313/504, 506; 428/690
See application file for complete search history.

(56) References Cited

U.S. PATENT DOCUMENTS

| | | | |
|---|---|---|---|
| 6,768,257 B1 * | 7/2004 | Yamada et al. | 313/504 |
| 6,876,144 B2 | 4/2005 | Peng | |
| 7,456,562 B2 * | 11/2008 | Yokoyama | 313/495 |
| 2005/0040392 A1 * | 2/2005 | Wu et al. | 257/40 |
| 2005/0136289 A1 * | 6/2005 | Chu et al. | 428/690 |
| 2005/0242346 A1 | 11/2005 | Forrest et al. | |

(Continued)

FOREIGN PATENT DOCUMENTS

JP     2000-173777     6/2000

(Continued)

OTHER PUBLICATIONS

Yu et al. Applied Physics Letters, 2005, 87, 222115 (3 pages).*

(Continued)

*Primary Examiner*—David Wu
*Assistant Examiner*—Vu A Nguyen
(74) *Attorney, Agent, or Firm*—Innovation Counsel LLP

(57) ABSTRACT

According to an embodiment of the present invention, an OLED display includes a substrate, a first electrode, a hole transport layer, a hole blocking layer, an emitting layer, and a second electrode. The first electrode is formed on the substrate. The hole transport layer is formed on the first electrode and includes a first material having a first highest occupied molecular orbital (HOMO) level and a first lowest unoccupied molecular orbital (LUMO) level. The hole blocking layer is formed on the hole transport layer and includes a second material having a second HOMO level and a second LUMO level. The emitting layer is formed on the hole blocking layer and includes a third material having a third HOMO level and a third LUMO level. The second electrode is formed on the emitting layer. Herein, the second HOMO level is higher than the first HOMO level and the third HOMO level.

12 Claims, 11 Drawing Sheets

U.S. PATENT DOCUMENTS

2006/0279490 A1 * 12/2006 Park et al. .................. 345/76

FOREIGN PATENT DOCUMENTS

| JP | 2005-150080 | 6/2005 |
| JP | 2005-150082 | 6/2005 |
| JP | 2005-150084 | 6/2005 |
| KR | 10-0359945 | 4/2002 |
| KR | 10-0435203 | 2/2003 |

OTHER PUBLICATIONS

Patent Abstracts of Japan, Publication No. 2000-173777, Jun. 23, 2000, 1 p.

Patent Abstracts of Japan, Publication No. 2005-150080, Jun. 9, 2005, 1 p.

Patent Abstracts of Japan, Publication No. 2005-150082, Jun. 9, 2005, 1 p.

Patent Abstracts of Japan, Publication No. 2005-150084, Jun. 9, 2005, 1 p.

Korean Patent Abstracts, Publication No. 1020020028356, Apr. 17, 2002, 2 pp.

Korean Patent Abstracts, Publication No. 1020030015611, Feb. 25, 2003, 2 pp.

* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Patent Application No. 10-2006-0064377 filed in the Korean Intellectual Property Office, Republic of Korea, on Jul. 10, 2006, the entire content of which is incorporated by reference.

BACKGROUND OF THE INVENTION (a) Field of the Invention

The present invention relates to an organic light emitting diode (OLED) display and a method for manufacturing the same.

(b) Description of the Related Art

Recently, requirements for display devices, such as monitors and television sets, include devices that are thinner and lighter than in the past. In order to satisfy such requirements, liquid crystal displays (LCD) have replaced cathode ray tube (CRT) displays in many applications. However, an LCD requires an additional backlight for illumination because the LCD is a passive device. Also, the LCD has deficiencies in terms of response speed and viewing angle. For these reasons and others, displays incorporating an organic light emitting diode (OLED) have received increased attention.

An OLED display typically includes an emitting layer interposed between two electrodes, one for injecting electrons and the other for injecting holes to the emitting layer. The injected electrons and holes are coupled in the emitting layer, and excitons are thereby formed. The formed excitons emit light while losing energy. In this manner, the OLED display is a self-illuminating device that does not require an additional light source. Therefore, power consumption for an OLED display may be comparatively low. However, in order to further reduce the power consumption of the OLED display, the luminance efficiency thereof should be increased. Since the luminance efficiency is proportional to the number of excitons generated in the emitting layer, it requires electrons and holes to transfer in balance. Since hole mobility is generally greater than that of electrons, control of the hole mobility is required. In order to control the hole mobility, a hole blocking layer may be interposed between the emitting layer and a cathode. In this case, the current density of a driving voltage and the color stability thereof may be degraded because the mobility of electrons is also reduced with the hole mobility.

The above information disclosed in this Background section is only for enhancement of understanding of the background of the invention and therefore it may contain information that does not form the prior art that is already known in this country to a person of ordinary skill in the art.

SUMMARY

One or more embodiments of the present invention provide an organic light emitting diode (OLED) display having advantages including enhanced luminance efficiency and stabilized current characteristics and color stability. An exemplary embodiment of the present invention provides an organic light emitting diode (OLED) display including a substrate, a first electrode, a hole transport layer, a hole blocking layer, an emitting layer, and a second electrode. The first electrode is formed on the substrate. The hole transport layer is formed on the first electrode and includes a first material having a first highest occupied molecular orbital (HOMO) level and a first lowest unoccupied molecular orbital (LUMO) level. The hole blocking layer is formed on the hole transport layer and includes a second material having a second HOMO level and a second LUMO level. The emitting layer is formed on the hole blocking layer and includes a third material having a third HOMO level and a third LUMO level. The second electrode is formed on the emitting layer. Herein, the second HOMO level is higher than the first HOMO level and the third HOMO level.

In the display, the second LUMO level may be higher than the first LUMO level and the third LUMO level. The second HOMO level may be about 20% to about 26% higher that the first HOMO level. The second LUMO level may be about 16% to about 24% higher than the third LUMO level. The first material may include at least one of N,N'-bis-(1-naphtyl)-N, N'-diphenyl-1,1'-biphenyl-4,4'-diamine (NPB), N,N'-diphenyl-N,N'-bis(3-methylphenyl)-1,1'-biphenyl-4,4'-diamine (TPD), p-phenylenediamine (PPD), phthalocyanine, copper phthalocyanine (CuPc), 4,4',4''-Tris(3-methylphenyl-phenylamino)triphenylamine (m-MTDATA), Transmembrane Phosphatase with TEnsin homology (TPTE), polyaniline, and polythiophene. The second material may include at least one of 2,9-dimethyl-4,7-diphenyl-1,10-phenanthroline (BCP), 4,4'-N,N'-dicarbazole-biphenyl (CBP), and aluminum(III) bis(2-methyl-8-quinolinato) 4-phenylphenolate (BAlq). The third material may include at least one of tris(8-hydroxyquinolinato)aluminum (Alq3), anthracene, a distryl compound, a polyfluorene derivative, a (poly)paraphenylenevinylene derivative, a polyphenylene derivative, a polyfluorene derivative, polyvinylcarbazole, and a polythiophene derivative. The first material may be NPB, the second material may be BCP, and the third material may be Alq3. The hole blocking layer may have a thickness from about 0.5 nm to about 5 nm. The OLED display may further include an electron transport layer between the emitting layer and the second electrode. The OLED display may further include a first signal line and a second signal line, a first thin film transistor, and a second thin film transistor. The first signal line and the second signal line may be configured to cross each other and are disposed between the substrate and the first electrode. The first thin film transistor may be connected to the first and second signal lines, and the second thin film transistor may be connected to the first thin film transistor and the first electrode.

Another exemplary embodiment of the present invention provides a method of manufacturing an organic light emitting diode (OLED) display. The method includes providing a substrate and forming a first electrode, a hole transport layer, a hole blocking layer, an emitting layer, and a second electrode. The first electrode is formed on the substrate. The hole transport layer is formed on the first electrode and includes a first material having a first highest occupied molecular orbital (HOMO) level and a first lowest unoccupied molecular orbital (LUMO) level. The hole blocking layer is formed on the hole transport layer and includes a second material having a second HOMO level and a second LUMO level. The emitting layer is formed on the hole blocking layer and includes a third material having a third HOMO level and a third LUMO level. The second electrode is formed on the emitting layer. Herein, the second HOMO level is higher than the first HOMO level and the third HOMO level.

In the method, the second LUMO level may be higher than the first LUMO level and the third LUMO level. The second HOMO level may be about 20% to about 26% higher that the first HOMO level. The second LUMO level may be about 16% to about 24% higher than the third LUMO level. The first material may include at least one of N,N'-bis-(1-naphtyl)-N, N'-diphenyl-1,1'-biphenyl-4,4'-diamine (NPB), N,N'-diphenyl-N,N'-bis(3-methylphenyl)-1,1'-biphenyl-4,4'-diamine (TPD), p-phenylenediamine (PPD), phthalocyanine, copper phthalocyanine (CuPc), 4,4',4''-Tris(3-methylphenyl-phenylamino)triphenylamine (m-MTDATA), Transmembrane Phosphatase with TEnsin homology (TPTE), polyaniline, and polythiophene. The second material may include at least one of 2,9-dimethyl-4,7-diphenyl-1,10-phenanthroline (BCP), 4,4'-N,N'-dicarbazole-biphenyl (CBP), and aluminum(III) bis(2-methyl-8-quinolinato) 4-phenylphenolate (BAlq). The third material may include at least one of tris(8-hydroxyquinolinato)aluminum (Alq3), anthracene, a distryl compound, a polyfluorene derivative, a (poly)paraphenylenevinylene derivative, a polyphenylene derivative, a polyfluorene derivative, polyvinylcarbazole, and a polythiophene derivative. The first material may be NPB, the second material may be BCP, and the third material may be Alq3. The hole blocking layer may have a thickness from about 0.5 nm to about 5 nm. The OLED display may further include an electron transport layer between the emitting layer and the second electrode. The OLED display may further include a first signal line and a second signal line, a first thin film transistor, and a second thin film transistor. The first signal line and the second signal line may be configured to cross each other and are disposed between the substrate and the first electrode. The first thin film transistor may be connected to the first and second signal lines, and the second thin film transistor may be connected to the first thin film transistor and the first electrode.

DETAILED DESCRIPTION

Figure 1:
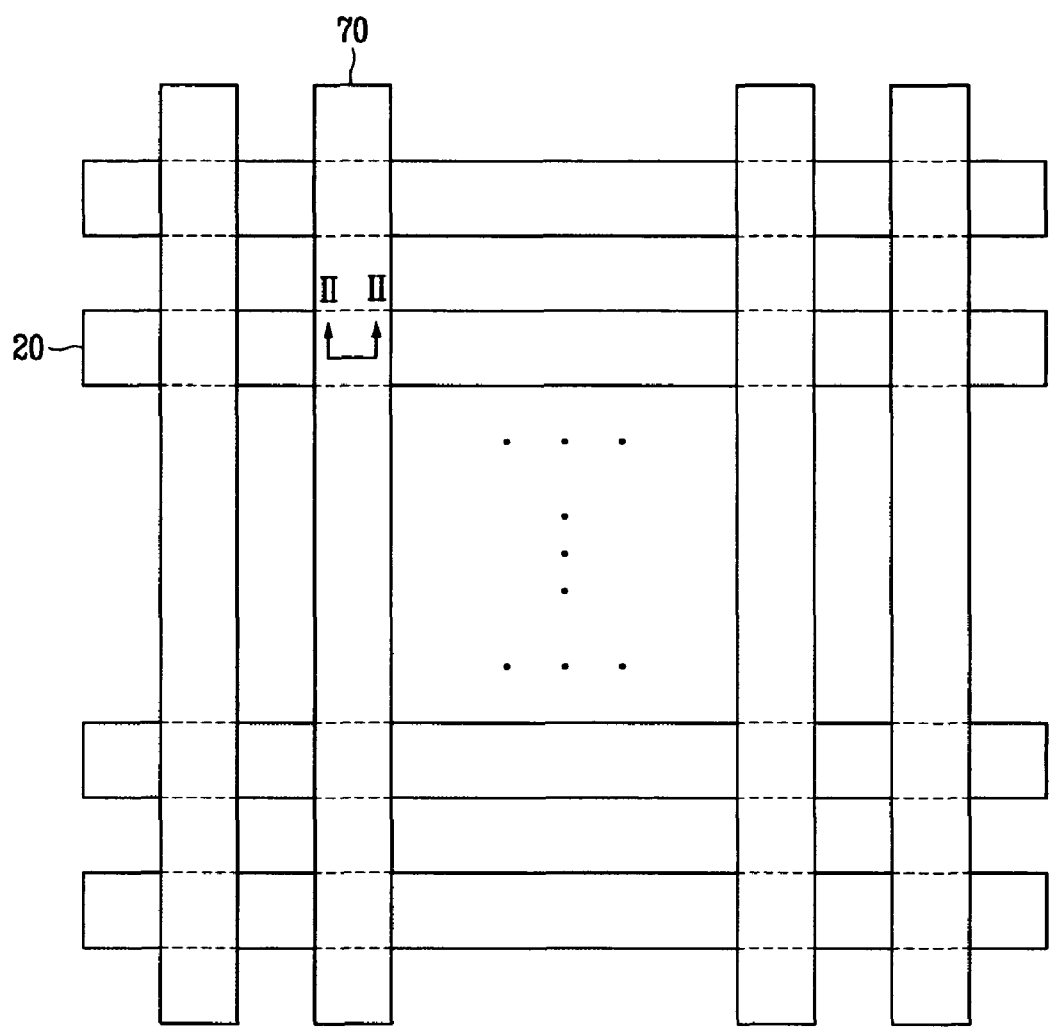
FIG. 1 is a plane view of a passive matrix OLED display according to an embodiment of the present invention.

Hereinafter, embodiments of the present invention will be described more fully hereinafter with reference to the accompanying drawings, in which one or more preferred embodiments of the invention are shown. As those skilled in the art would realize, the described embodiments may be modified in various different ways, all without departing from the spirit or scope of the present invention. In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
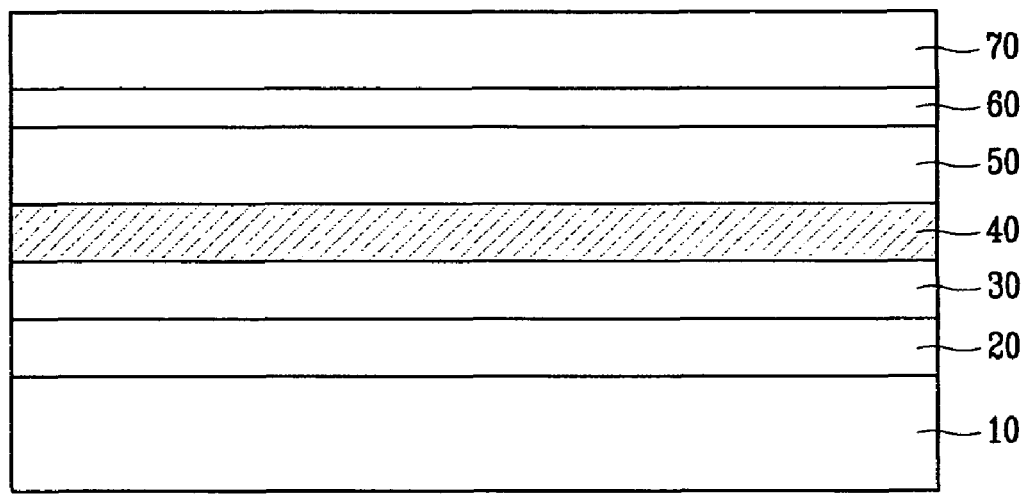
FIG. 2 is a cross-sectional view of the passive matrix OLED display of FIG. 1 taken along the line II-II.

An organic light emitting diode (OLED) display according to an embodiment of the present invention will now be described with reference to FIG. 1 and FIG. 2. FIG. 1 is a layout of a passive matrix OLED display according to an embodiment of the present invention, and FIG. 2 is a cross-sectional view of the passive matrix OLED display of FIG. 1 taken along the line II-II. A plurality of anodes 20 and a plurality of cathodes 70 are formed to cross one another on an insulating substrate 10 made of transparent glass or plastic. The anodes 20 are formed at a predetermined distance from one another and extend in one direction of the insulating substrate 10. The anodes 20 are electrodes used to inject holes (i.e. injection of positive charge carriers) where the anodes 20 are typically made of a transparent conductive material having a high work function, which allows emitted light to pass. For example, the transparent conductive material may be composed of indium tin oxide (ITO) or indium zinc oxide (IZO). Similarly, the cathodes 70 are formed at a predetermined distance from one another and extend in an other direction of the insulating substrate 10 so as to cross the anodes 20. The cathodes 70 are electrodes used to inject electrons (i.e. injection of negative charge carriers) where the cathodes 70 are typically made of a conductive material with a low work function that does not influence or disturb an organic material. For example, the cathodes 70 may be made of a conductive material such as aluminum (Al), calcium (Ca), and barium (Ba). An organic light emitting member is formed between the anodes 20 and the cathodes 70.

The organic light emitting member includes an emitting layer 50 and a plurality of auxiliary layers for improving the luminance efficiency of the emitting layer 50. The emitting layer 50 may be made of an organic material or a composition of an organic material and an inorganic material, and emits light in one of the primary colors, where the organic material and the composition may include aluminium tris(8-hydroxyquinoline) (Alq3), anthracene, a distryl compound, a polyfluorene derivative, a (poly)paraphenylenevinylene derivative, a polyphenylene derivative, polyvinylcarbazole, a polythiophene derivative, or a polymer doped with a perylene pigment, a cumarine pigment, a rhodermine pigment, rubrene, perylene, 9,10-diphenylanthracene, tetraphenylbutadiene, Nile red, coumarin, or quinacridone. The OLED display displays images by spatially summing light of primary colors emitted from the emitting layer.

The auxiliary layers includes a hole transport layer 30, an electron transport layer 60, and a hole blocking layer 40 for balancing the electrons and holes. The hole transport layer 30 is positioned between the anodes 20 and the emitting layer 50, and facilitates smooth transfer of holes from the anode 20 to the emitting layer 50. The hole transport layer 30 may comprise a material having a highest occupied molecular orbital (HOMO) level between a work function of the anode 20 and HOMO level of the emitting layer 50. For example, the hole transport layer 30 may comprise at least one of N,N'-bis-(1-naphtyl)-N,N'-diphenyl-1,1'-biphenyl-4,4'-diamine (NPB), N,N'-diphenyl-N,N'-bis(3-methylphenyl)-1,1'-biphenyl-4, 4'-diamine (TPD), p-phenylenediamine (PPD), phthalocyanine, copper phthalocyanine (CuPc), 4,4',4"-Tris(3-methylphenyl-phenylamino)triphenylamine (m-MTDATA), polyaniline, and polythiophene. The electron transport layer 60 is positioned between the emitting layer 50 and the cathodes 70, and facilitates easy transfer of the electrons from the cathode 70 to the emitting layer 50. The electron transport layer 60 may comprise a material having a lowest unoccupied molecular orbital (LUMO) level between the work function of the cathodes 70 and LUMO level of the emitting layer 50, for example lithium fluoride (LiF), lithium quinolate (Liq), oxadiazole, triazole, or triazine. The hole blocking layer 40 is positioned between the emitting layer 50 and the hole transport layer 30, and the hole blocking layer 40 can appropriately control the hole mobility that transfer from the hole transport layer 30 to the emitting layer 50. Controlling hole mobility will be described in detail with reference to FIGS. 1-3.

Figure 3:
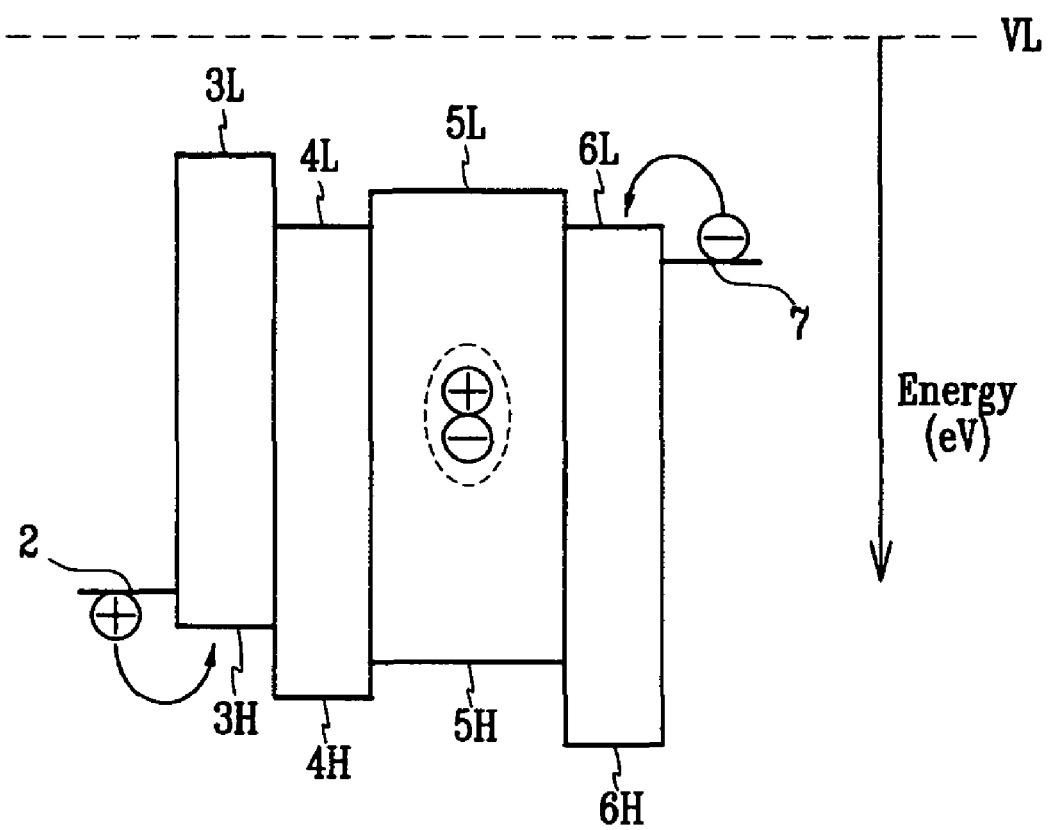
FIG. 3 is a schematic view showing energy levels of each layer in an OLED display according to an embodiment of the present invention.

FIG. 3 is a schematic view showing energy levels of each layer in the OLED display of FIGS. 1 and 2. Referring to FIG. 3, from the left to the right in a horizontal direction, 2 denotes the energy level (work function) of anodes 20, 3H and 3L denote the HOMO level and the LUMO level of the hole transport layer 30, 4H and 4L denote the HOMO level and LUMO level of the hole blocking layer 40, 5H and 5L denote the HOMO level and LUMO level of the emitting layer 50, 6H and 6L denote the HOMO level and LUMO level of the electron transport layer 60, and 7 denotes the energy level (work function) of the cathodes 70. The vertical axis shows energy levels (eV) with a vacuum level (VL) as reference. The term "work function" means an energy required to transfer a charge at a Fermi level to a vacuum level (VL). Therefore, the energy level shown in FIG. 3 is equivalent to the absolute value of a work function.

First, the transfer of a hole from the anodes 20 to the emitting layer 50 will be described. The hole is injected from the anodes 20 having a work function 2 of about −5.0 eV, and it reaches the HOMO level 5H of the emitting layer 50 after passing the HOMO level 3H of the hole transport layer 30 and the HOMO level 4H of the hole blocking layer 40. In this case, the work function 2 of the anodes 20, the HOMO level 3H of the hole transport layer 30, and the HOMO level 5H of the emitting layer 50 gradually increase as shown in FIG. 3 along the transfer path of the hole, that is, the anodes 20, the hole transport layer 30, and the emitting layer 50. The hole transfers from the anodes 20, the hole transport layer 30, and the emitting layer 50 along the energy levels. Meanwhile, the OLED display according to the present embodiment may further include a hole blocking layer 40 between the hole transport layer 30 and the emitting layer 50. As shown in FIG. 3, the HOMO level 4H of the hole blocking layer 40 is higher than the HOMO level 3H of the hole transport layer 30 and the HOMO level 5H of the emitting layer 50. Since the hole blocking layer 40 has a higher energy level than the HOMO level 3H of the hole transport layer 30 and the HOMO level 5H of the emitting layer 50 is positioned between the hole transport layer 30 and the emitting layer 50, the energy difference between the HOMO level 3H of the hole transport layer 30 and the HOMO level 4H of the hole blocking layer 40 and the energy difference between the HOMO level 4H of the hole blocking layer 40 and the HOMO level 5H of the emitting layer 50 work as a barrier that blocks the transfer of the hole. Therefore, the energy level difference reduces the hole mobility.

In order to appropriately control the hole mobility, it is preferable that the HOMO level 4H of the hole blocking layer 40 is about 20% to about 26% higher than the HOMO level 3H of the hole transport layer 30. If the energy level difference is less than about 20%, it is difficult to form the energy barrier. If the energy level difference is greater than about 26%, the hole mobility is significantly lowered so the number of holes transported to the emitting layer becomes significantly reduced as well. Materials having an energy level that is different from the hole transport layer are, for example, 2,9-dimethyl-4,7-diphenylphenanthroline (BCP), 4,4-bis(carbazol-9-yl)-biphenyl (CBP) and aluminum(III)bis(2-methyl-8-quinolinato)4-phenylphenolate (BAlq).

The transfer of an electron from the cathodes 70 to the emitting layer 50 will now be described. The electron is injected from the cathodes 70 having a work function 7 of about 4.2 to 4.3 eV, and it reaches the LUMO level 5L of the emitting layer 50 after passing the LUMO level 6L of the electron transport layer 60. The electrons reaching the emitting layer 50 are recombined with holes to form excitons, and the excitons emit light by losing energy. Meanwhile, some electrons may pass the emitting layer 50 without being recombined with the holes. However, since the LUMO level 4L of the hole blocking layer 40 has a higher energy level than the LUMO level 5L of the emitting layer 50, it becomes a barrier for the electrons. Therefore, the number of electrons gathered at the interface between the emitting layer 50 and the hole blocking layer 40 increases by the electrons not passing the emitting layer 50. Accordingly, more electrons may be generated due to the increment of the electrons. Herein, the energy level difference between the LUMO level 5L of the emitting layer 50 and the LUMO level 4L of the hole blocking layer 40 works as a barrier to block the electrons from passing the emitting layer 50. The energy level difference may be about 16% to about 24%.

As described above, the number of holes gathered at the interface between the hole transport layer 30 and the hole blocking layer 40 increases because the energy barrier between the hole transport layer 30 and the hole blocking layer 40 blocks the holes from reaching the emitting layer 50. Such holes may generate a positive internal electric field. Accordingly, the holes may attract the electrons having the negative polarity to increase the number of electrons flowing into the emitting layer 50 from the cathodes 70. Therefore, the internal quantum efficiency may be improved by increasing the number of excitons generated in the emitting layer 50. A position generating the excitons may be restricted to around the interface between the hole blocking layer 40 and the emitting layer 50 by reducing the hole mobility and attracting the electrons at the same time. Accordingly, color stability can be enhanced because the spectrum variation according to the variation of voltage become smaller. Although the hole blocking layer 40 has a small thickness, for example at about 0.5 to 5 nm, the hole blocking layer 40 provides the same result. Therefore, it is not required to increase the driving voltage even though a new layer is inserted.

The current density, the luminance efficiency, and the color stability were analyzed by manufacturing OLED displays according to an exemplary embodiment of the present invention and in reference to a comparative example. The term exemplary denotes merely an example and does not necessarily comprise an ideal embodiment among other disclosed embodiments.

Exemplary Embodiment

The OLED display shown in FIG. 1 and FIG. 2 is manufactured as an exemplary embodiment of the present invention. Anodes 20 were formed on an insulating substrate 10 by sputtering a transparent conductive material such as ITO or IZO. Then, the insulating substrate 10 was placed in a chamber with acetone or isopropyl alcohol and cleaned with ultrasonic waves. After cleaning, an oxygen plasma process was performed on the insulating substrate 10 to improve the interfacial property of the anodes 20. A hole transport layer 30 was then formed by depositing NPB on the anodes 20 at a thickness of about 45 nm to abut 49.5 nm under a vacuum. A hole blocking layer 40 was formed by depositing BCP on the hole transport layer 30 at a thickness of about 0.5 nm to about 5 nm. Then, an emitting layer 50 was formed by depositing Alq3 on the hole blocking layer 40, and an electron transport layer 60 was formed by depositing Liq on the emitting layer 50. Finally, cathodes 70 were formed on the electron transport layer 60 by sputtering Al on the electron transport layer 60. Thereby, the OLED display having ITO/NPB/BCP/Alq3/Liq/Al sequentially stacked on the substrate was manufactured.

Comparative Example

An OLED display according to the comparative example does not include the hole blocking layer 40, unlike the OLED display according to the exemplary embodiment. That is, an OLED display having ITO/NPB/Alq3/Liq/Al sequentially stacked on a substrate was manufactured as the comparative example.

Figure 4:
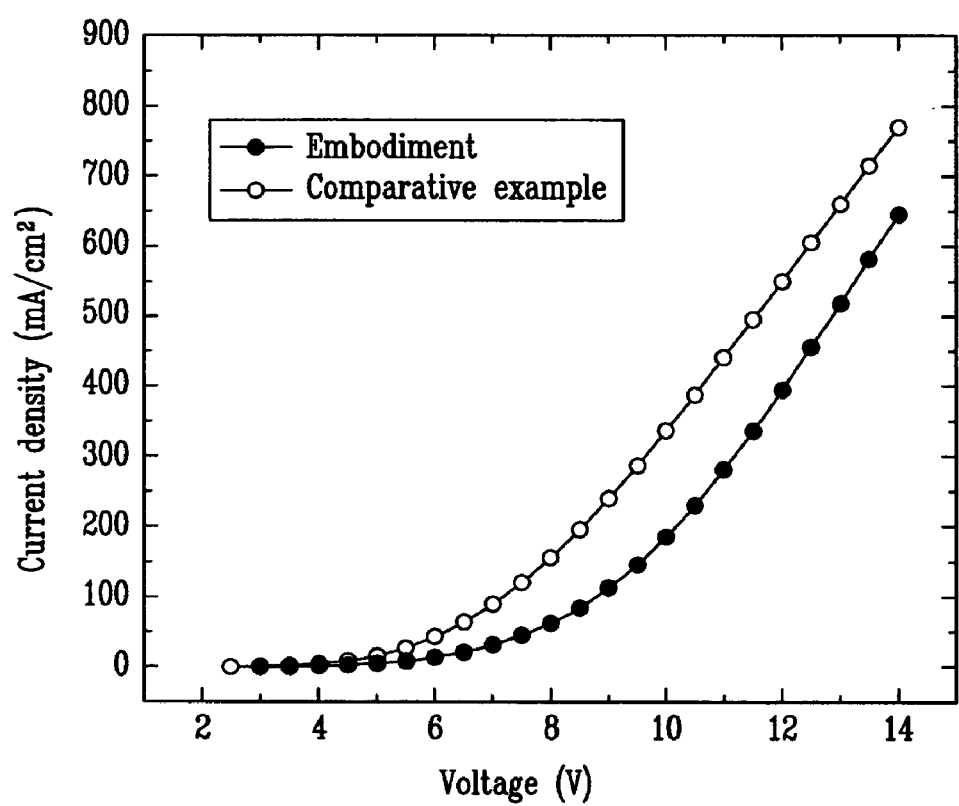
FIG. 4 is a graph showing the current density and luminance of OLED displays according to an exemplary embodiment and a comparative example.

Hereinafter, the current density, the luminance efficiency, and the color stability of the OLED displays according the exemplary embodiment and according to the comparative example will be described with reference FIG. 4 to FIG. 7. First, the current density will be described with reference to FIG. 4. FIG. 4 is a graph showing the current density of the OLED displays according to an exemplary embodiment and comparative example. The current density was measured by supplying voltages from 0 to 15V with the voltage increasing by units of 0.5V to the OLED displays according to the exemplary embodiment and the comparative example using a KEITHLEY Model: 236 SOURCE-MEASURE UNIT, available from Keithley Instruments, Inc. of Cleveland, Ohio, USA.

As shown in FIG. 4, the turn-on voltages of the OLED displays according to the exemplary embodiment and comparative example are 3.5 V, and they have similar current densities. The OLED display according to the exemplary embodiment has lower hole mobility than that of the OLED display according to the comparative example because the OLED display according to the exemplary embodiment further includes the hole blocking layer. Therefore, the OLED display according to the exemplary embodiment has slightly lower current density. However, the difference between these is not large.

Figure 5:
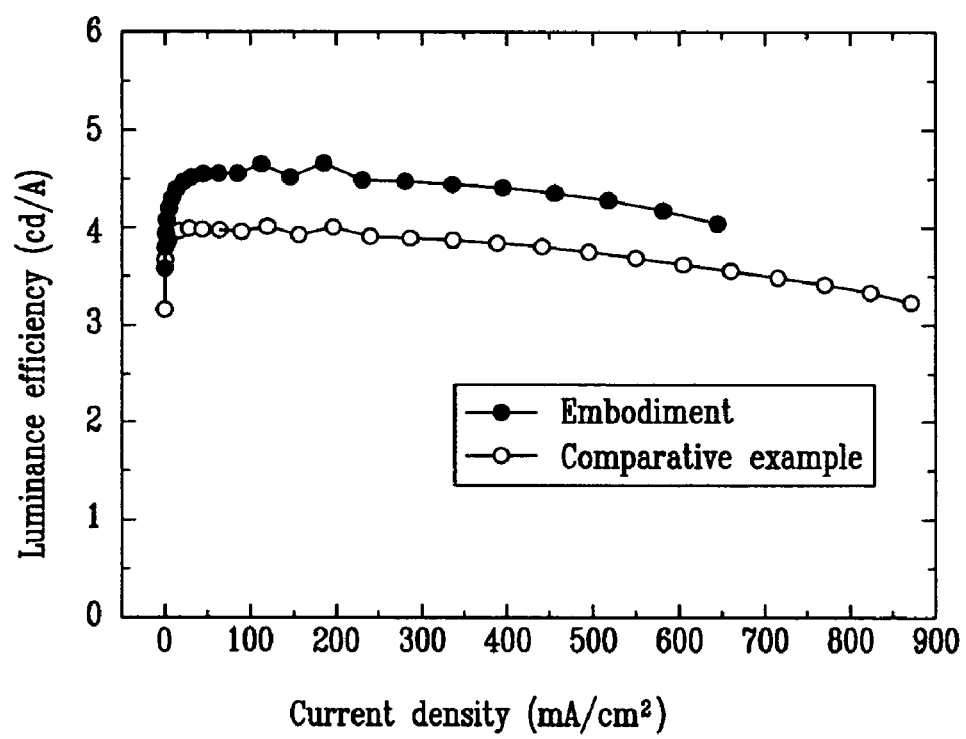
FIG. 5 is a graph showing the luminance efficiency against the current density of the OLED displays according to the exemplary embodiment and the comparative example.

The luminance efficiency is now analyzed with reference to FIG. 5. FIG. 5 is a graph showing the luminance efficiency versus the current density of the OLED displays according to the exemplary embodiment and the comparative example. The current density versus the current efficiency is examined based on the measuring result obtained from FIG. 4. As a result, at a current density higher than about 100 mA/cm$^2$, the OLED display according to the embodiment has a current efficiency of about 4.5 cd/A to about 5.0 cd/A, and the OLED display according to the comparative example has a current efficiency of about 3.5 cd/A to about 4.0 cd/A. As described above, the OLED display according to the embodiment has higher current efficiency than the OLED display according to the comparative example that does not have a hole blocking layer.

Figure 6:
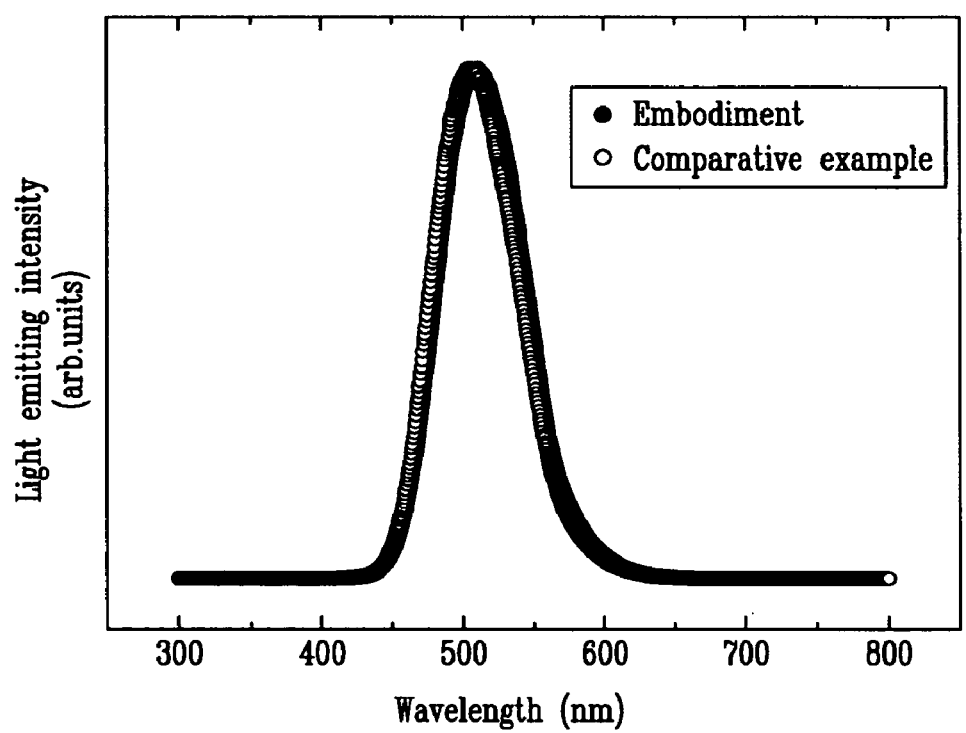
FIG. 6 and FIG. 7 are graphs showing color purity and color stability in OLED displays according to the exemplary embodiment and the comparative example.
Figure 7:
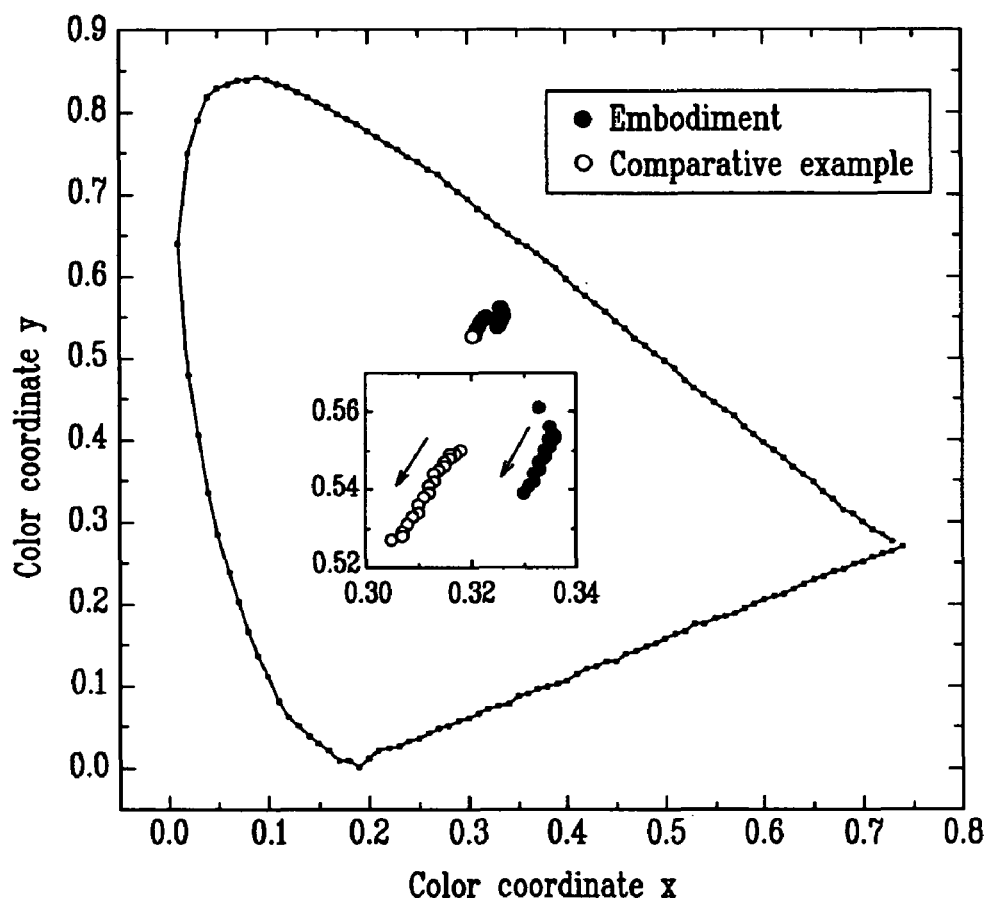

Hereinafter, color purity and color stability will be described with reference to FIG. 6 and FIG. 7. FIG. 6 and FIG. 7 are graphs showing color purity and color stability in OLED displays according to the exemplary embodiment and the comparative example. FIG. 6 is a graph obtained by measuring the light emitting intensity according to wavelength after supplying about 11 V to the OLED displays according to the exemplary embodiment and the comparative example. The color purity is high if high light emitting intensity is shown at a narrow wavelength range. As shown in FIG. 6, the OLED displays according to the exemplary embodiment and the comparative example have similar color purities. Both of the OLED displays emit green light at about 500 nm. However, the OLED displays according to the exemplary embodiment and the comparative example have different color stability, as shown in FIG. 7. FIG. 7 is a graph illustrating color coordinates measured while changing voltage supplied to the OLED displays according to the exemplary embodiment and the comparative example. The color stability is high if the color coordinate varies only slightly according to the variation of voltage. As shown in FIG. 7, the OLED display according to the exemplary embodiment has higher color stability than the OLED display according to the comparative example. As shown in FIG. 4 to FIG. 7, the OLED display according to the exemplary embodiment provides superior luminance efficiency and color stability compared to the OLED display according to the comparative example, while the OLED display according to the exemplary embodiment provides similar current density and color purity.

Figure 8:
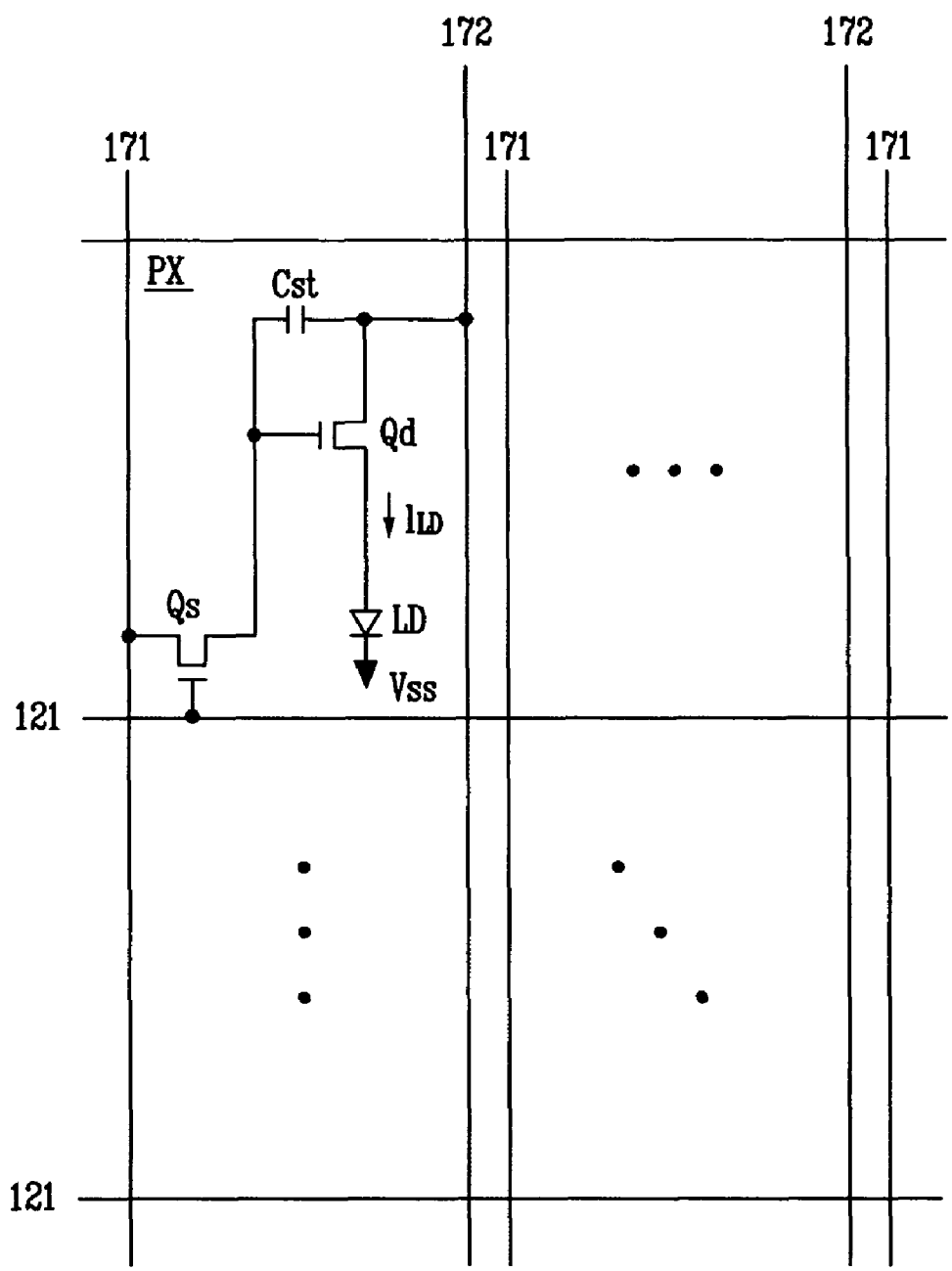
FIG. 8 is an equivalent circuit diagram of an active matrix OLED (AMOLED) display according to an exemplary embodiment of the present invention.

Hereinafter, an OLED display according to an embodiment of the present invention will be described with reference to FIG. 8 to FIG. 11. In the present embodiment, an active matrix OLED display will be described, unlike the aforementioned OLED display. Descriptions of the same elements will be omitted. FIG. 8 is an equivalent circuit diagram of an active matrix OLED (AMOLED) display according to an embodiment of the present invention. Referring to FIG. 8, the OLED display according to the present embodiment includes a plurality of signal lines 121, 171, and 172, and a plurality of pixels (PX) connected to the signal lines 121, 171 and 172 and arranged in a substantially matrix-like arrangement. The signal lines include a plurality of gate lines 121 for transferring (i.e. transmitting) a gate signal or a scan signal, a plurality of data lines 171 for transferring a data signal, and a plurality of driving voltage lines 172 for transferring the driving voltage. The gate lines 121 extend in about a row direction and are parallel to each other. The data lines 171 and the driving voltage lines 172 extend in about a column direction and are substantially parallel to each other.

Each pixel PX includes a switching transistor Qs, a driving transistor Qd, a storage capacitor Cst, and an organic light emitting diode LD. The switching transistor Qs includes a control terminal, an input terminal, and an output terminal. The control terminal is connected to the gate line 121, the input terminal is connected to the data line 171, and the output terminal is connected to the driving transistor Qd. The switching transistor Qs transfers the data signal, which is supplied to the data line 171 in response to the scan signal supplied to the gate line 121, to the driving transistor Qd. The driving transistor Qd also includes a control terminal, an input terminal, and an output terminal. The control terminal is connected to the switching transistor (Qs), the input terminal is connected to the driving voltage line 172, and the output terminal is connected to an organic light emitting diode (Ld). The driving transistor Qd flows an output current $I_{LD}$ having an amplitude that varies according to the voltage between the control terminal and the output terminal. The storage capacitor Cst is formed between the control terminal and the input terminal of the driving transistor Qd. The storage capacitor Cst charges the data signal supplied to the control terminal of the driving transistor Qd and sustains it after the switching transistor Qs is turned off. The organic light emitting diode LD includes an anode connected to the output terminal of the driving transistor Qd and a cathode connected to a common voltage Vss. The organic light emitting diode (LD) displays images by emitting light with different intensities according to the output current ($I_{LD}$) of the driving transistor Qd. The switching transistor Qs and the driving transistor Qd are typically n-channel field effect transistors (FETs). However, at least one of the switching transistor Qs and the driving transistor Qd may be a p-channel FET. Also, the interconnection between the transistors Qs and Qd, the storage capacitor Cst, and the organic light emitting diode LD may be different from what is shown.

Figure 9:
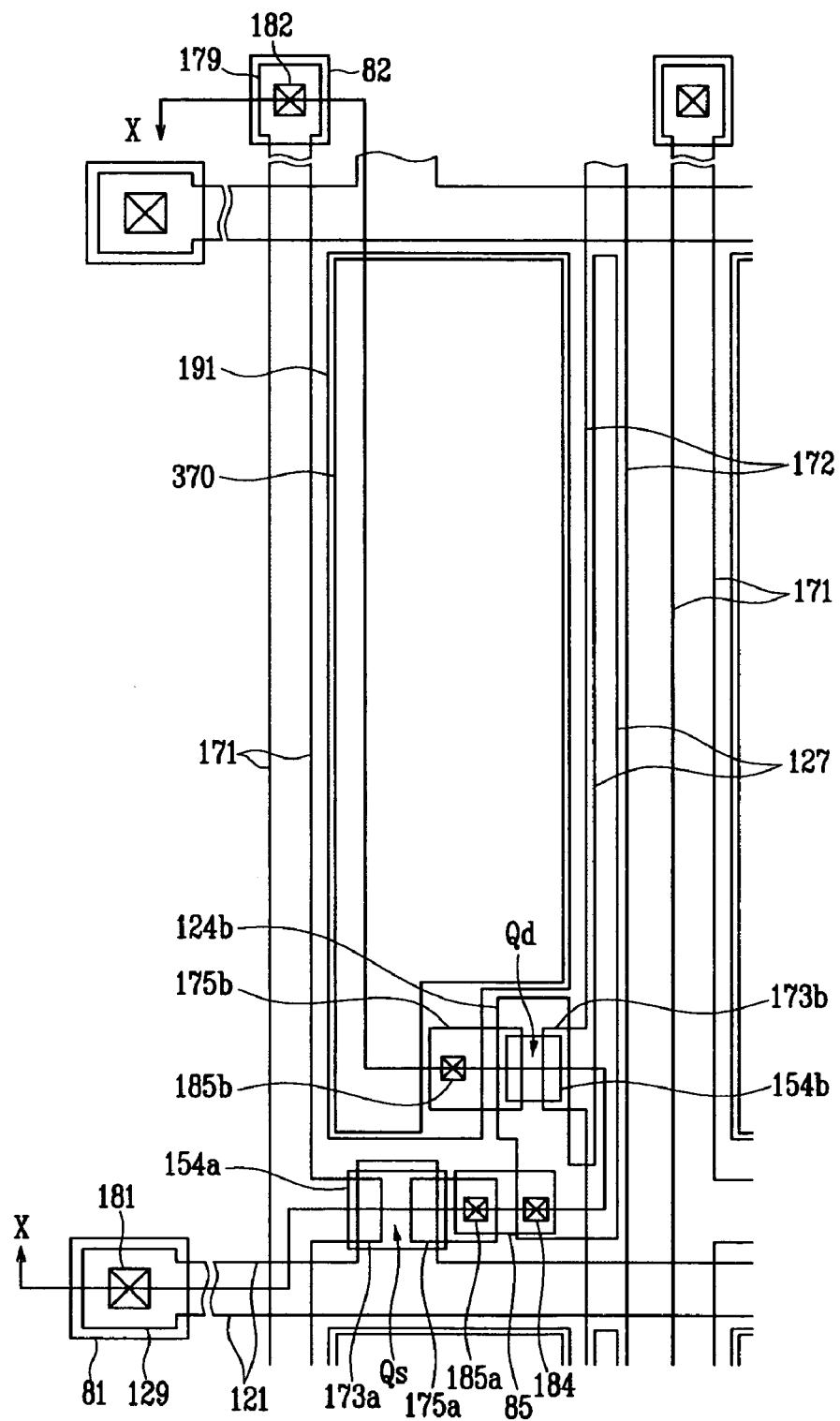
FIG. 9 shows a layout of the AMOLED display according to another embodiment of the present invention.
Figure 10:
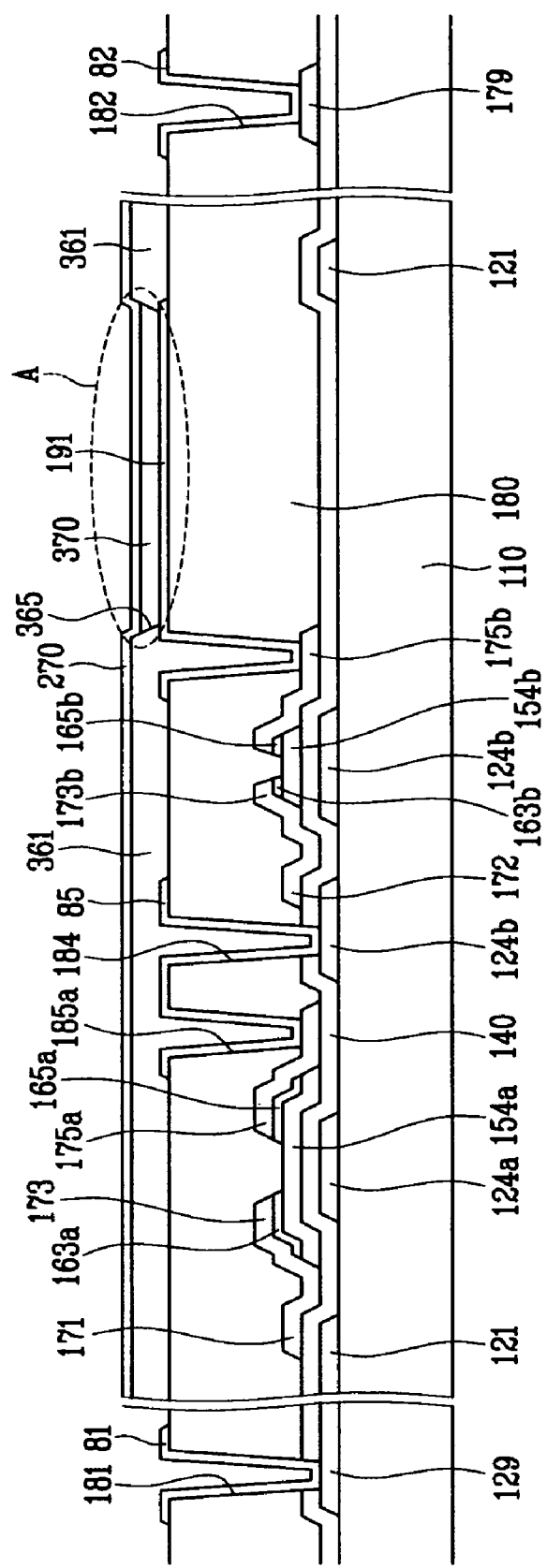
FIG. 10 is a cross-sectional view of the AMOLED display of FIG. 9 taken along the line X-X.
Figure 11:
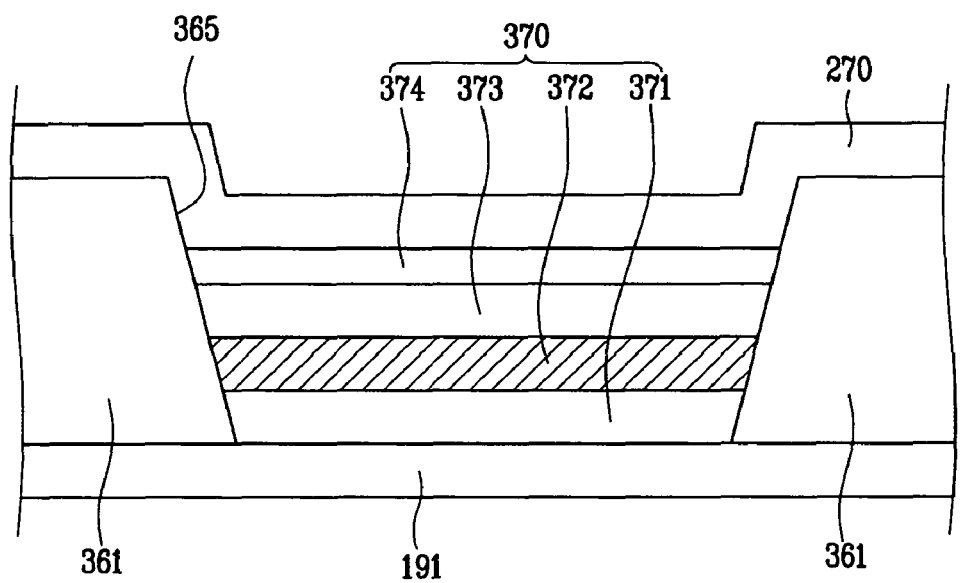
FIG. 11 is a magnified view of the 'A' region of the AMOLED display shown in FIG. 10.

Hereinafter, the structure of the OLED display shown in FIG. 8 will be described with reference to FIG. 9 to FIG. 11. FIG. 9 shows a layout of the AMOLED display according to another embodiment of the present invention, FIG. 10 is a cross-sectional view of the AMOLED display of FIG. 9 taken along the line X-X, and FIG. 11 is a magnified view of the 'A' region of the AMOLED display shown in FIG. 10. A plurality of gate conductors, each of which includes a plurality of gate lines 121 having a first control electrode 124a and a plurality of a second control electrode 124b having a storage capacitor 127, are formed on an insulating substrate 110. The gate lines 121 transfer a gate signal and basically extend in a horizontal direction. Each of the gate lines 121 includes a wide end portion 129 for connecting to another layer or an external driving circuit, and the first control electrode 124a upwardly extends from the gate line 121. If a gate driving circuit (not shown) that generates a gate signal is integrated on the substrate 110, the gate line 121 is extended to be directly connected to the gate driving circuit.

As shown, the second control electrode 124b is separated from the gate line 121 and includes a storage electrode 127 extending in one direction. The gate conductors 121 and 124b may be made of an Al containing metal such as Al or an Al alloy, a Ag containing metal such as Ag or Ag alloy, a Cu containing metal such as Cu or a Cu alloy, a Mo containing metal such as Mo or a Mo alloy, Cr, Ta, and Ti. However, they may have a multi-layer structure including two conductor layers (not shown) having different physical characteristics. The sides of the gate conductors 121 and 124b are inclined to the substrate 110, and it is preferable that the inclination angle thereof is about 30° to about 80°. A gate insulating layer 140 made of silicon nitride (SiNx) or silicon oxide ($SiO_2$) is formed on the gate conductors 121 and 124b.

A plurality of semiconductors 154a and 154b, which are made of hydrogenated amorphous silicon (a-Si) or polysilicon, are formed on the gate insulating layer 140. The first semiconductor 154a is place on the first control electrode 124a. The second semiconductor 154b is placed on the second control electrode 124b. A plural of pairs of the first ohmic contacts 163a and 165a, and a plural of pairs of the second ohmic contacts 163b and 165b are formed on the first semiconductor 154a and the second semiconductor 154b, respectively. The ohmic contacts 163a, 163b, 165a, and 165b may be made of n+ hydrogenated amorphous silicon highly doped with an n-type impurity such as P, or silicide, if they are of an island shape. The first ohmic contacts 163a and 165a are disposed on the first semiconductor 154a as a pair, and the second ohmic contacts 163b and 165b are disposed on the second semiconductor 154b as a pair.

A plurality of data conductors, each of which includes a plurality of data lines 171, a plurality of driving voltage lines 172, and a plurality of the first and the second output electrodes 175a and 175b, are formed on the ohmic contacts 163a, 163b, 165a, and 165b and the gate insulating layer 140. The data lines 171 transfer the data signal and extend in a vertical direction to cross the gate lines 121. Each of the data lines 171 includes a plurality of first input electrodes 173a extending toward the first control electrode 124a and a wide end portion 179 to be connected to another layer or an external driving circuit. When a data driving circuit (not shown) that generates a data signal is directly integrated on the substrate 110, the data line 171 extends to be directly connected to the data driving circuit. The driving voltage lines 172 transfer a driving voltage and extend in the vertical direction to cross the gate lines 121. Each of the driving voltage lines 172 includes a plurality of the second input electrodes 173b extending toward the second control electrodes 124b, and includes a portion overlapped with the storage electrode 127.

First and second output electrodes 175a and 175b are separated from one another, and are separated from the data lines 171 and the driving voltage lines 172. The first input electrode 173a and the first output electrode 175a face one another on the first semiconductor 154a, and the second input electrode 173b and the second output electrode 175b face one another on the second semiconductor 154b. It is preferable that the data conductors 171, 172, 175a, and 175b may be made of a material having thermal resistance such as Mo, Cr, Ta, and Ti, and alloys thereof, and they may have a multi-layer structure including a thermal resistance layer (not shown) and a low resistive conductor layer (not shown). Similar to the gate conductors 121 and 124b, it is preferable that the sides of the data conductors 171, 172, 175a, and 175b may be inclined to the substrate 110 at about 30° to about 80°. The ohmic contacts 163a, 163b, 165a, and 165b are only placed between the semiconductors 154a and 154b and the data conductors 171, 172, 175a, and 175b, and they lower the contact resistance therebetween. The semiconductors 154a and 154b include exposed regions between the input electrodes 173a and 173b and the output electrodes 175a and 175b, which are not covered by the data conductors 171, 172, 175a, and 175b.

A passivation layer 180 is formed on the data conductors 171, 172, 175a, and 175b, and on the exposed semiconductors 154a and 154b. The passivation layer 180 may be made of an inorganic insulating material or an organic insulating material, and the surface of the passivation layer 180 may be flat. For example, the inorganic insulating material may be SiNx or $SiO_2$. It is preferable that the organic insulating material has a photosensitive property, and that the dielectric constant thereof is smaller than about 4.0. However, the passivation layer 180 may have a double-layer structure formed of an inorganic layer at the top and an organic layer at the bottom in order to not negatively influence the exposed semiconductors 154a and 154b while sustaining the superior insulating characteristics of the organic layer. A plurality of contact holes 182, 185a, and 185b are formed in the passivation layer 180 to expose the end portions 179 of the data lines 171 and the first and second output electrodes 175b. Also, a plurality of contact holes 181 and 184 are formed in the passivation layer 180 and the gate insulating layer 140 to expose the end portions 129 of the gate lines 121 and the second input electrodes 124b. A plurality of pixel electrodes 191, a plurality of connecting members 85, and a plurality of contact assistants 81 and 82 are formed on the passivation layer 180. They may be made of a transparent conductive material such as ITO or IZO, or a reflective material such as Al, Ag, or alloys thereof.

The pixel electrode 191 is physically and electrically connected to the second output electrode 175b through the contact hole 185b. The connecting member 85 is connected to the second control electrode 124b and the first output electrode 175a through the contact holes 184 and 185a. The contact assistants 81 and 82 are connected to the end portions 129 of the gate lines 121 and the end portions 179 of the data lines 171 through contact holes 181 and 182. The contact assistants 81 and 82 complement the adhesive property between the end portions 129 and 179 of the gate line 121 and the data line 171 and an external device, and protect them.

An insulating bank 361 is formed on the passivation layer 180. The insulating bank 361 has an opening which surrounding the edges of the pixel electrode 191, and may be made of an organic insulating material or an inorganic insulating material. The insulating bank functions as partitions. The insulating bank 361 may be made of a photosensitive material including a black pigment. In this case, the insulating bank 361 functions as a light blocking member and its manufacturing process is very simple. An organic light emitting member 370 is formed in an opening 365. The organic light emitting member 370 includes an emitting layer 373 and a plurality of auxiliary layers 371, 372, and 374 for improving luminance efficiency. The auxiliary layers 371, 372, and 374 include a hole transport layer 371, a hole blocking layer 372, and an electron transport layer 374. As described above in the aforementioned embodiment, the hole blocking layer 372 has a higher HOMO level and a higher LUMO level than the hole transport layer 371 and the electron transport layer 374. Therefore, the luminance efficiency can be improved by appropriately controlling the hole mobility. A common electrode 270 is formed on the organic light emitting member 370. An encapsulation layer (not shown) may be formed on the common electrode 270. The encapsulation layer may prevent moisture and/or oxygen from penetrating by encapsulating the organic light emitting member 370 and the common electrode 270.

In the OLED display, the first control electrode 124a connected to the gate line 121, the first input electrode 173a connected to the data line 171, and the first output electrode 175a form a switching TFT Qs with the first semiconductor 154a. The channel of the switching TFT Qs is formed in the first semiconductor 154a between the first input electrode 173a and the first output electrode 175a. The second control electrode 124b connected to the first output electrode 175a, the second input electrode 173b connected to the driving voltage line 172, and the second output electrode 175b connected to the pixel electrode 191 form the driving TFT Qd with the semiconductor 154b. The channel of the driving TFT Qd is formed in the semiconductor 154b between the second input electrode 173b and the second output electrode 175b. In order to increase the driving current, the channel width of the driving TFT transistor Qd is enlarged and the channel length is shortened.

The pixel electrode 191, the organic light emitting member 370, and the common electrode 270 form an organic light emitting diode LD. The pixel electrode 191 may become an anode and the common electrode 270 becomes a cathode. On the contrary, the pixel electrode 191 may become the cathode while the common electrode 270 becomes the anode. Also, the storage electrode 127 and the driving voltage line 172, which are overlapped with one another, form a storage capacitor Cst. Meanwhile, an intrinsic region (not shown) facing the control electrodes 124a and 124b and extrinsic regions (not shown) disposed at both sides of the intrinsic region are included when the semiconductors 154a and 154b are made of polycrystalline silicon. The extrinsic region is electrically connected to the input electrodes 173a and 173b and the output electrodes 175a and 175b. The ohmic contacts 163a, 163b, 165a, and 165b may be omitted. Also, the control electrodes 124a and 124b may be placed on the semiconductors 154a and 154b, respectively. In this case, the gate insulating layer 140 is placed between the semiconductors 154a and 154b and the control electrodes 124a and 124b. Herein, data conductors 171, 172, 173b, and 175b are placed on the gate insulating layer 140 and are electrically connected to the semiconductors 154a and 154b through contact holes (not shown) formed on the gate insulating layer 140. Alternatively, the data conductors 171, 172, 173b, and 175b may electrically contact the semiconductors 154a and 154b by placing the data conductors 171, 172, 173b, and 175b under the semiconductors 154a and 154b. As described above, the brightness, the luminance efficiency, the color purity, and the color stability of the OLED display are improved by controlling the hole mobility transferring from the electrode to the emitting layer according to the embodiment of the present invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising:
   a substrate;
   a first electrode formed on the substrate;
   a hole transport layer formed on the first electrode and comprising a first material having a first highest occupied molecular orbital (HOMO) level and a first lowest unoccupied molecular orbital (LUMO) level;
   a hole blocking layer formed on the hole transport layer and comprising a second material having a second HOMO level and a second LUMO level;
   an emitting layer formed on the hole blocking layer and comprising a third material having a third HOMO level and a third LUMO level; and
   a second electrode formed on the emitting layer,
   wherein the second HOMO level is higher than the first HOMO level and the third HOMO level,
   wherein the second LUMO level is higher than the first LUMO level and the third LUMO level, and
   wherein the first material comprises at least one of p-phenylenediamine (PPD), phthalocyanine, copper phthalocyanine (CuPc), Transmembrane Phosphatase with TEnsin homology (TPTE), polyaniline, and polythiophene;
   the second material comprises at least one of 4,4'-N,N'-dicarbozole-biphenyl (CBP), and aluminum(III) bis(2-methyl-8-quinolinato) 4-phenylphenolate (BAlq); and
   the third material comprises at least one of anthracene, a distyryl compound, a polyfluorene derivative, a (poly) paraphenylenevinylene derivative, a polyphenylene derivative, a polyvinylcarbazole, and a polythiophene derivative.

2. The OLED display of claim 1, wherein the second HOMO level is about 20% to about 26% higher than the first HOMO level.

3. The OLED display of claim 1, wherein the second LUMO level is about 16% to about 24% higher than the third LUMO level.

4. The OLED display of claim 1, wherein the hole blocking layer has a thickness from about 0.5 nm to about 5 nm.

5. The OLED display of claim 1, further comprising an electron transport layer between the emitting layer and the second electrode.

6. The OLED display of claim 1, further comprising:
a first signal line and a second signal line configured to cross each other, the first signal line and the second signal line being disposed between the substrate and the first electrode;
a first thin film transistor connected to the first and second signal lines; and
a second thin film transistor connected to the first thin film transistor and the first electrode.

7. A method of manufacturing an organic light emitting diode (OLED) display, the method comprising:
providing a substrate;
forming a first electrode on the substrate;
forming a hole transport layer on the first electrode, the hole transport layer comprising a first material having a first highest occupied molecular orbital (HOMO) level and a first lowest unoccupied molecular orbital (LUMO) level;
forming a hole blocking layer on the hole transport layer, the hole blocking layer comprising a second material having a second HOMO level and a second LUMO level;
forming an emitting layer on the hole blocking layer, the emitting layer comprising a third material having a third HOMO level and a third LUMO level; and
forming a second electrode on the emitting layer,
wherein the second HOMO level is higher than the first HOMO level and the third HOMO level, and
wherein the second LUMO level is higher than the first LUMO level and the third LUMO level,
wherein the first material comprises at least one of p-phenylenediamine (PPD), phthalocyanine, copper phthalocyanine (CuPc), Transmembrane Phosphatase with TEnsin homology (TPTE), polyaniline, and polythiophene,
wherein the second material comprises at least one of 4,4'-N,N'-dicarbazole-biphenyl (CBP), and aluminum(III) bis(2-methyl-8-quinolinato) 4-phenylphenolate (BAlq), and
wherein the third material comprises at least one of anthracene, a distyryl compound, a polyfluorene derivative, a (poly) paraphenylenevinylene derivative, a polyphenylene derivative, a polyvinylcarbazole, and a polythiophene derivative.

8. The method of claim 7, wherein the second HOMO level is about 20% to about 26% higher than the first HOMO level.

9. The method of claim 7, wherein the second LUMO level is about 16% to about 24% higher than the third LUMO level.

10. The method of claim 7, wherein the hole blocking layer has a thickness from about 0.5 nm to about 5 nm.

11. The method of claim 7, further comprising forming an electron transport layer between the emitting layer and the second electrode.

12. The method of claim 7, further comprising:
forming a first signal line and a second signal line configured to cross each other, the first signal line and the second signal line being formed between the substrate and the first electrode;
forming a first thin film transistor connected to the first and second signal lines; and
forming a second thin film transistor connected to the first thin film transistor and the first electrode.

* * * * *